United States Patent [19]
Yanagawa et al.

[11] Patent Number: 5,723,261
[45] Date of Patent: Mar. 3, 1998

[54] PHOTOPOLYMERIZABLE COMPOSITION

[75] Inventors: Makoto Yanagawa, Kamifukuoka; Shinji Santoo, Tokorozawa, both of Japan

[73] Assignee: Tamura Kaken Co., Ltd., Saitama, Japan

[21] Appl. No.: 787,765

[22] Filed: Jan. 28, 1997

Related U.S. Application Data

[63] Continuation of Ser. No. 508,721, Jul. 28, 1995, abandoned, Continuation-in-part of Ser. No. 605,028, Oct. 29, 1990, abandoned.

[30] Foreign Application Priority Data

Nov. 30, 1989 [JP] Japan ................................ 1-311710

[51] Int. Cl.$^6$ ............................ G03F 7/031; G03F 7/038
[52] U.S. Cl. ........................... 430/285.1; 430/286.1; 430/287.1; 522/121
[58] Field of Search ........................... 430/286.1, 285.1; 522/121

[56] References Cited

U.S. PATENT DOCUMENTS

| | | | |
|---|---|---|---|
| 3,448,089 | 6/1969 | Celeste | 260/78.5 |
| 3,980,483 | 9/1976 | Nishikubo et al. | 96/115 R |
| 3,989,610 | 11/1976 | Tsukada et al. | 204/159.15 |
| 4,025,348 | 5/1977 | Tsukada et al. | 96/115 R |
| 4,806,450 | 2/1989 | Hofmann et al. | 430/281.1 |
| 4,855,215 | 8/1989 | Nakano et al. | 430/283.1 |
| 4,970,135 | 11/1990 | Kushi et al. | 430/280 |

FOREIGN PATENT DOCUMENTS

| | | |
|---|---|---|
| 50-144431 | 11/1975 | Japan . |
| 51-40451 | 11/1976 | Japan . |
| 56-40329 | 9/1981 | Japan . |
| 57-45785 | 9/1982 | Japan . |
| 61-243869 | 10/1986 | Japan . |
| 62-285903 | 12/1987 | Japan . |
| 63-11930 | 1/1988 | Japan . |
| 63-72710 | 4/1988 | Japan . |
| 63-97601 | 4/1988 | Japan . |
| 63-205649 | 8/1988 | Japan . |
| 217908 | 12/1986 | United Kingdom . |

*Primary Examiner*—Cynthia Hamilton
*Attorney, Agent, or Firm*—Felfe & Lynch

[57] ABSTRACT

The present invention relates to a photopolymerizable composition; more specifically, the present invention relates to a photopolymerizable composition useful as photoimageable solder mask of one component type, which can form image by ultraviolet exposure and development in an aqueous solution of dilute alkali after film formation and which has excellent ultraviolet curability and heat resistance of solder. The composition contains a reaction product, a diluent and a sensitizer, the reaction product being produced by adding epoxy group-containing acrylic acid ester or epoxy group-containing methacrylic acid ester to a part of the carboxyl group of the copolymer of acrylic acid ester or methacrylic acid ester with acrylic acid or methacrylic acid.

12 Claims, No Drawings

PHOTOPOLYMERIZABLE COMPOSITION

BACKGROUND OF THE INVENTION

This application is a continuation of application Ser. No. 08/508,721, filed Jul. 28, 1995, now abandoned, which is a continuation-in-part of application Ser. No. 07/605,028 filed on Oct. 29, 1990 now abandoned, which is incorporated by reference herein.

DESCRIPTION OF THE PRIOR ART

Printed circuit boards have been commonly used in order to compactly mount electronic parts. A printed circuit board is fabricated by etching copper foil of a laminate, following its circuit wiring, where electronic parts are arranged and soldered at predetermined positions.

A solder mask is used in a process prior to the soldering of electronic parts on such printed circuit boards to form a film on the whole surface of a circuit conductor, excluding the part thereof being soldered. Such a film is indispensable for the soldering procedure on circuit conductive, because it functions as an insulating film to prevent it form soldering on an unnecessary portions as well as it works as a protective film to prevent oxidation of the circuit conductive by direct exposure to atmosphere and corrosion thereof with humidity.

Conventionally, such solder mask has been formed by screen printing on a board and curing with ultraviolet light or heat thereon. In order to achieve the realization of high density board, the development of print circuit board has been directed toward improving, mass fabrication and one board system, so that printed circuit board has been integrated at a remarkable pace. Along with such process, the mounting methods thereof have transferred into the surface mount technology (SMT) more than ever. Solder mask has been required to have higher resolution and higher precision and to satisfy a higher degree of reliability. In place of the screen printing technique, there has been proposed liquid photoimageable solder mask technique with better positional precision and better coating ability on the part of conductive edge, for forming all types of solder mask, regardless of its basic board either for consumer use or industrial use. For example, there is disclosed solder mask compositions comprising epoxy acrylate, sensitizer, epoxy compound, epoxy curing agent, in Japanese Patent Laid-open No. 144431/1975 and Japanese Patent Laid-open No. 40451/1976. In these solder mask compositions, unexposed parts are removed using organic solvents when in developing. However, the process to remove unexposed parts (namely, developing) with organic solvents is a problem in terms of possible risk of environmental pollution, fire and the like, because a vast amount of organic solvents is sued in the process. In particular, the problem concerning environmental pollution has recently been drawing far more attention in association with the influence on humans. It is a great concern how to measure the pollution.

In order to solve the problem there has been proposed a photopolymerizable solder mask of alkaline developing type, which can be developed in an aqueous solution of dilute alkali.

As an ultraviolet curing material of alkaline developing solder mask, there is disclosed in Japanese Patent Laid-open No. 40329/1981 and Japanese Patent Laid-open No. 45785/1982, a material containing as the base polymer a reaction product which is produced by reacting unsaturated monocarboxylic acid with epoxy resin, followed by addition of polybasic acid anhydride. In Japanese patent Laid-open No. 243869/1986, there is also disclosed a liquid solder mask composition comprising an epoxy resin of novolack type, which has excellent heat- and chemical resistance and can be developed in an aqueous solution of dilute alkali.

However, these solder mask compositions are of two components type because the compositions of one component type are not stable. It is therefore difficult to store them for a long time after mixing up the two components.

As compositions comprising copolymer as the base polymer thereof, compositions comprising half ester compounds composed of copolymer of styrene and maleic acid anhydride are disclosed in Japanese Patent Laid-open No. 11930/1988 and Japanese Patent Laid-open No. 205649/1988. But there is a problem concerning stability for all of the compositions, because they contain epoxy resin. There are disclosed compositions comprising modified copolymer containing maleic acid anhydride in Japanese patent Laid-open No. 285903/1987, Japanese Patent Laid-open No. 72710/1988 and Japanese Patent Laid-open No. 97601/1988. However, the copolymer before modification is hard to be solubilized in solvents commonly used, so that costly imide solvents must be used for the solubilization thereof. Furthermore, the retention of the solvents is considered to affect the property as solder mask. Since the base polymer disclosed in Japanese Patent Laid-open No. 97601/1988 contains a vast amount of imide ring, the polymer has a drawback such that its solubility into solvents may be deteriorated along with the decreased stability of the base polymer of itself.

SUMMARY OF THE INVENTION

The present invention is summarized as a photopolymerizable composition consisting essentially of a reaction product, a diluent and an sensitizer, the reaction product being produced by the process wherein to a part of the carboxyl group of a copolymer comprising at least one or two or more of acrylic acid ester and/or methacrylic acid ester represented by the general formula (1);

wherein $R_1$ is a hydrogen atom or methyl group; $R_2$ is aliphatic hydrocarbon group having carbon atoms of 1 to 6 and acrylic acid and/or methacrylic acid represented by the general formula (2);

wherein $R_1$ has the same meaning described above is added acrylic acid ester and/or methacrylic acid ester having at its terminal an epoxy group, represented by the general formula (3);

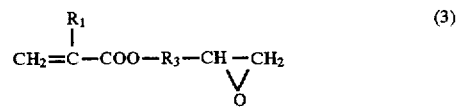

wherein $R_1$ has the same meaning as described above; $R_3$ is aliphatic hydrocarbon group or aromatic hydrocarbon group containing carbon atoms of 1 to 12.

The photopolymerizable composition is a liquid photoimageable solder mask of one component type and has excellent ultraviolet curability and heat resistance of solder, which can form image by ultraviolet exposure and developing in an aqueous solution of dilute alkali, after film formation.

DETAILED DESCRIPTION OF THE INVENTION

The present invention is a photopolymerizable composition containing a reaction product, a diluent and an sensitizer, the reaction product being produced by adding acrylic acid ester and/or methacrylic acid ester having epoxy group at its terminal, to a part of the carboxyl group of the copolymer comprising at least one or two or more of acrylic acid ester and methacrylic acid ester, and acrylic acid and/or methacrylic acid, a diluent and an sensitizer. The composition is a photopolymerizable composition useful as a liquid photoimageable solder mask of one component type, which is capable of being developed in an aqueous solution of dilute alkali and is superior in stability, ultraviolet light curability, heat resistance, flexibility and electric properties.

The copolymer of acrylic acid ester and/or methacrylic acid ester and acrylic acid and/or methacrylic acid is obtained by copolymerizing one or two or more of acrylic acid ester and/or methacrylic acid ester represented by the general formula (1);

wherein $R_1$ is a hydrogen atom or methyl group; $R_2$ is aliphatic hydrocarbon group having carbon atoms of 1 to 6 and acrylic acid and/or methacrylic acid represented by the general formula (2);

wherein $R_1$ has the same meaning aforementioned, according to the routine methods such as solution polymerization.

Preferable molar ratio between acrylic acid ester and/or methacrylic acid ester and acrylic acid and/or methacrylic acid is 30:70 to 70:30.

If the compounding ratio between acrylic acid ester and/or methacrylic acid ester and acrylic acid and/or methacrylic acid is less than the latter ratio, the added amount of epoxy group-containing acrylic acid ester and/or epoxy group-containing methacrylic acid ester to the copolymer may be reduced consequently, leading to the deteriorated ultraviolet curability; on the other hand, if the ratio is more, the humidity resistance of the resulting cured coating film may be decreased.

Accordingly, the range described above is preferable.

The ester group of each of acrylic acid ester and/or methacrylic acid ester may be appropriately selected from various aliphatic groups containing carbon atoms 1 to 6.

The reaction product is obtained by adding, to the copolymer thus obtained, acrylic acid ester and/or methacrylic acid ester having epoxy group at its terminal, represented by the following general formula (3);

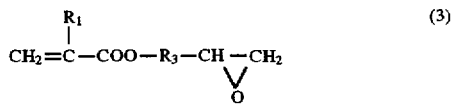

wherein $R_1$ has the same meaning as described above; $R_3$ is aliphatic hydrocarbon group or aromatic hydrocarbon group having carbon atoms of 1 to 12.

In order to obtain the reaction product of the present invention, the compound of the general formula (3) is added to the aforementioned monomers of the general formulae (1) and (2) at a ratio of 10 to 40 mol %, to provide the copolymer with ultraviolet curability.

As has been described above, if the added amount of acrylic acid ester and/or ethacrylic acid ester containing epoxy group represented by the general formula (3) to the copolymer is less, there may be caused the deterioration of ultraviolet curability and properties of cured coating film; on the other hand, if the amount is too much, the stability of the resin may be decreased in storage. Thus, the range aforementioned is preferable.

The reaction product thus obtained by the present invention is preferably the one within the range that the weight averaged molecular weight is 20,000 to 70,000; the softening point is 35° to 130° C. and the acid value is 50 to 150.

If the weight averaged molecular weight thereof is too small, heat resistance of the reaction product may be reduced; if it is too large, the solubility into diluents and working properties of the reaction product may possibly be deteriorated. If the softening point is too low, there remains tack even after the coating and drying of the resulting composition of the present invention, so that there may possibly be caused some adhesion of the composition to art work films at exposure and luster shading on the cured coated film; if it is too high, it is likely to cause the tendency such that ultraviolet curability is damaged. Furthermore, if the acid value is low, the removability of the coated film with an aqueous solution of dilute alkali may be reduced; if the acid value is too high, the electric- and humidity resistance properties of the cured coated film tend to be deteriorated.

The diluent to be used in the present invention is preferably an unsaturated compound of a boiling point of 100° C. or more under atmospheric pressure, having at least two or more acryloyl groups or methacryloyl groups; representative examples thereof include ethylene glycol diacrylate, ethylene glycol dimethacrylate, diethylene glycol diacrylate, diethylene glycol dimethacrylate, glycerin triacrylate, glycerin trimethacrylate, propylene diacrylate, propylene dimethacrylate, 1,2,4-butanetriol triacrylate, 1,2,4-butanetriol trimethacrylate, 1,4-benzenediol diacrylate, 1,4-benzenediol dimethacrylate, polyethylene glycol bisacrylate of a molecular weight of 200 to 500, polyethyleneglycol bismethacrylate of a molecular weight of 200 to 500, trimethylolpropanetriacrylate, trimethyrolpropanetrimethacrylate, pentaerythritol tetraacrylate, pentaerythritol tetramethacrylate, dipentaerythritolhexacrylate, dipentaerythritolhexamethyacrylate; oligomers such as melamine acrylate, epoxy acrylate, urethane acrylate, polyester acrylate; methylene bisacrylamide, methylene bismethacrylamide, diethylenetriamine triacrylamide bis(methacrylamidepropoxy)-ethane, diethylenetriamine trimethacrylamide bis(methacrylamide propoxy)ethane, bismethacrylamide ethylmethacrylate-N-] (β-hydroxyethyloxy)ethyl]acrylamide, triacryl isocyanate, trimethacryl isocyanate, etc. Furthermore, if needed, organic solvents such as ethyleneglycol monoalkylethers, diethyleneglycol monoalkylethers, ethyleneglycol dialkylethers, diethyleneglycol dialkylethers, ethyleneglycol monoalkylether acetates, diethyleneglycol monoalkylacetates, cyclohexanone, tetrahydronaphthalene, petroleium naphtha, etc. may be used as a diluent for the objective to use the composition of the present invention in its easy applicable form.

There is no specific limitation to the sensitizer to be used in the present invention; particularly, the use of the combination of 2-methyl[4-(methylthio)phyenyl]-2-morpholyno-1-propane as a principal sensitizer with one kind or two kinds of other sensitizers may bring about remarkably excellent ultraviolet curability. The sensitizer to be used in the aforementioned combination include p-phenylbenzophenone, benzyldimethylketal, 2,4- dimethylthioxanthone, 2,4-diethylthioxanthone, benzoin ethyl ether, benzoin isopropyl ether, benzoin isobutyl ether, 4,4'-diethylaminobenzophenone, p-dimethylaminobenzoic acid ethylester.

As has been described above, the photopolymerizable composition of the present invention comprises the addition product of the copolymer (a), the diluent component (b) and the sensitizer component (c), and their compounding ratio is preferably such that (a):(b) is 30:70 to 70:30, while the sensitizer (c) is 1 to 10 parts by weight to 100 parts by weight of the sum of (a) and (b). If necessary, there may be added to the composition various additives such as extender pigment including silica, talc, alumina, calcium carbonate, clay, aerosol, etc., coloring pigment including chrome phthal yellow, cyanine green, etc., anti-foaming agent including silicone and fluoride compounds, leveling agent, antioxidant, etc. For the objective to improve heat resistance of cured coating film, epoxy resin or phenol resin may be used in combination as a component for heat curing. But in that case, care should be taken of the stability of the composition.

The photopolymerizable composition of the present invention described above is coated at a desirable thickness on a board and heated at 60°–80° C. for 15 to 60 minutes for evaporating the organic solvents. Subsequently, a desirable pattern with a transparent imaging part is arranged in contact to the coated film on the board before ultraviolet irradiation, to exposure selectively the desired pattern. The composition in the exposed part of the coated film is thereby alternatively cross-linking together and gets insoluble. Then, unexposed region is removed with an aqueous solution of dilute alkali, to develop the coated film. Generally, there may be employed a sodium carbonate aqueous solution of 0.5 to 5 wt % as the aqueous solution of dilute alkali to be used in the above process, but other alkalis may be used as well. Preferably, the pattern thus obtained is subjected to reaction (second curing) with ultraviolet ray, heat of 100° to 200° C. and far infrared ray.

Examples for producing the addition product of the copolymer according to the present invention and Examples of the present invention will now be explained, but the present invention is not limited to those Examples.

EXAMPLE 1

Methylmethacrylate (MMA), ethylmethacrylate (EMA) and methacrylic acid of a molar ratio of 1:1:2, sequentially, were subjected to solution polymerization in 40 wt % ethylcellosolve as solvent in nitrogen gas atmosphere at 60° C., using azobisisobutylonitrile (AIBN) as catalyzer. Subsequently, 0.8 mol (20 mol %) of glycidyl methacrylate (GMA) was added to the polymerized product. The results of analysis of the reaction product were; weight averaged molecular weight was 35,000, softening point was 75° C. and acid value was 130. The product is defined as [A-1].

The product produced in the same manner as in Example 1, employing 30 mol % of GMA is defined as [A-2]; the product produced in the same manner as in Example 1, employing 7 mol % of GMA is defined as [A-3].

Weight averaged molecular weight, softening point and acid value of these products are shown in Table 1 below.

TABLE 1

| Physical Property | Added amt. of GMA (mol %) | Weight Averaged Molecular Weight | Softening point (°C.) | Acid Value |
|---|---|---|---|---|
| Reaction product A-2 | 30 | 41,000 | 30 | 120 |
| Reaction Product A-3 | 7 | 39,000 | 85 | 140 |

EXAMPLE 2

Fifty (50) parts by weight of the product [A-1] produced in Example 1, 30 parts by weight of trimethylol propane triacrylate, 3 parts by weight of 2-methyl[4-(methylthio)phenyl]-2-molpholynopropanone, 0.5 part by weight of diethylaminobenzophenone, 5 parts by weight of silica, 10 parts by weight of talc, 0.5 part by weight of cyanine green, and 1 part of KS-66 silicone anti-foaming agent manufactured by Shinetsu Chemicals K.K. were kneaded with a roll mill to obtain a photopolymerizable composition.

EXAMPLE 3

Seventy-five (75) parts by weight of the product [A-1] produced in Example 1, 5 parts by weight of trimethylol propane triacylate, 3 parts by weight of 2-methyl[4-(methylthio)phenyl]-2-molpholyno-1-proprane, 0.5 part by weight of diethylaminobenzophenone, 5 parts by weight of silica, 10 parts by weight of talc, 0.5 part by weight of cyanine green, and 1 part of KS-66 [silicone anti-foaming agent manufactured by Shinetsu Chemicals K.K.] were kneaded with a roll mill to obtain a photopolymerizable composition.

EXAMPLE 4

Fifty (50) parts by weight of the product [A-2] produced in Example 1, 30 parts by weight of trimethylol propane triacrylate, 3 parts by weight of 2-methyl[4-(methylthio)phenyl]-2-molpholyno-1-propane, 0.5 part by weight of diethylaminobenzophenone, 0.5 part by weight of cyanine green, and 1 part of KS-66 were kneaded with a roll mill to obtain a photopolymerizable composition.

EXAMPLE 5

Fifty (50) parts by weight of the product [A-3] produced in Example 1, 30 parts by weight of trimethylol propane triacylate, 3 parts by weight of 2-methyl[4-(methylthio)phenyl]-2-molpholyno-1-propane, 0.5 part by weight of diethylaminobenzophenone, 0.5 part by weight of cyanine green, and 1 part of KS-66 were kneaded with a roll mill to obtain a photopolymerizable composition.

The effects of the photopolymerizable compositions of the present invention thus obtained in Examples are shown hereinafter.

By screen printing, each photopolymerizable composition described above was coated at a thickness of 20 to 30 μm on the whole surface of a pattern-formed copper clad laminate after surface treatment. Subsequently, the coated laminate was dried with a circulated hot air dryer at 70° C. for 20 minutes, to which was closely contacted an art work film with a desirable pattern, followed by exposure to 20-second irradiation of ultraviolet light with an intensity of 25 mW/cm$^2$ and the peak wave length of 365 nm. The exposed laminate was developed in an aqueous solution of 1% sodium carbonate for 60 seconds, and then heated and cured in a circulated hot air dryer at 150° C. for 30 minutes.

After drying, no tack was observed in the composition of Example 2. Precise pattern corresponding to the art work film was completely developed on the coated film, which had a degree of hardness of 5H, and excellent flexibility, adhesion, ethylene chloride resistance and hydrogen chloride resistance. No change was observed in the coated film even after three cycles of 30-second dipping (soldering) in a solder bath at 260° C., which indicates that the composition sufficiently satisfies the property required for solder mask. When the compositions of Examples 3 and 5 were subjected to two cycles of 30-second dipping in a solder bath at 260° C., there was not observed any problem at a first cycle. There were obtained approximately the same results as in the composition of Example 2, except that a small degree of stripping of the coated film occurred at the heat resistance test mentioned on the above. The composition of Example 4 showed approximately identical properties as that of Example 2, except that a slight degree of tack was observed after drying.

We claim:

1. A photopolymerizable composition useful as a solder mask consisting essentially of:

(a) a copolymer possessing carboxyl groups, said copolymer being obtained by copolymerizing at least one compound of the formula (1):

$$CH_2=C(R_1)-COOR_2 \quad (1)$$

with at least one compound of the formula (2)

$$CH_2=C(R_1)-COOH \quad (2)$$

wherein $R_1$ is a hydrogen atom or a methyl group and $R_2$ is a $C_1$ to $C_6$ aliphatic hydrocarbon group,
   wherein at least a portion of said carboxyl groups of said copolymer are esterified by addition of a compound having the general formula (3):

$$CH_2=C(R_1)-COO-R_3-CH\underset{O}{\overset{\vee}{-}}CH_2 \quad (3)$$

wherein $R_1$ has the same meaning as above, and $R_3$ is a $C_1$–$C_{12}$ aliphatic or aromatic hydrocarbon group, and wherein said copolymer has a weight average molecular weight of 20,000 to 70,000, a softening point of 30° C. to 130° C., and an acid value of 120 to 150, (b) a sensitizer comprising 2-methyl(4-methylthio) phenyl)-2-morpholino-1-propane as a main component and containing one or more different types of sensitizers, and (c) a diluent having a boiling point of 100° C. or more under atmospheric pressure and containing an unsaturated compound having at least two methacryloyl or acryloyl groups.

2. The photopolymerizable composition of claim 1, wherein said copolymer has a molar ratio of compounds (1) to (2) from 30:70 to 70:30.

3. The photopolymerizable composition of claim 1, wherein said copolymer contains two or more compounds of general formula (1).

4. The photopolymerizable composition of claim 1, wherein the added molar number of said compound of general formula (3) in said copolymer is from 10 mol % to 40 mol % of the content of said compounds having general formulae (1) and (2).

5. The photopolymerizable composition of claim 1, wherein the ratio of said copolymer to said diluent is from 30:70 to 70:30 by weight, and wherein said photopolymerization initiator is present in an amount from 1 to 10 parts by weight of 100 parts by weight of the sum of said copolymer and diluent.

6. A photopolymerizable composition useful as a solder mask consisting essentially of:

(a) a copolymer possessing carboxyl groups, and which is a reaction product of at least one compound having the formula (1):

$$CH_2=C(R_1)-COOR_2 \quad (1)$$

wherein $R_1$ is a hydrogen atom or methyl group and $R_2$ is a $C_1$ to $C_6$ aliphatic hydrocarbon group, and at least one compound having the general formula (2):

$$CH_2=C(R_1)-COOH \quad (2)$$

wherein $R_1$ has the same meaning as in (1), and wherein at least a portion of said carboxyl groups of said copolymer are esterified by addition of a compound having the general formula (3):

$$CH_2=C(R_1)-COO-R_3-CH\underset{O}{\overset{\vee}{-}}CH_2 \quad (3)$$

wherein $R_1$ has the same meaning as in (1) and (2), and $R_3$ is a $C_1$–$C_{12}$ aliphatic or aromatic hydrocarbon group, and wherein said copolymer has a weight average molecular weight of 20,000 to 70,000, a softening point of 30° C. to 130° C., and an acid value of 120 to 150, (b) a sensitizer comprising 2-methyl(4-methylthio) phenyl)-2-morpholino-1-propane as a main component and containing one or more different types of sensitizers, and (c) a diluent having a boiling point of 100° C. or more under atmospheric pressure and containing an unsaturated compound having at least two methacryloyl or acryloyl groups.

7. The photopolymerizable composition of claim 6, wherein said copolymer has a molar ratio of compounds (1) to (2) from 30:70 to 70:30.

8. The photopolymerizable composition of claim 6, wherein said copolymer contains two or more compounds of general formula (1).

9. The photopolymerizable composition of claim 6, wherein the added molar number of said compound of general formula (3) in said copolymer is from 10 mol % to 40 mol % of the content of said compounds having general formulae (1) and (2).

10. The photopolymerizable composition of claim 6, wherein the ratio of said copolymer to said diluent is from 30:70 to 70:30 by weight, and wherein said photopolymerization initiator is present in an amount from 1 to 10 parts by weight of 100 parts by weight of the sum of said copolymer and diluent.

11. A photopolymerizable composition useful as a solder mask comprising:

(a) a copolymer possessing carboxyl groups, and which is a reaction product consisting essentially of at least one compound having the formula (1):

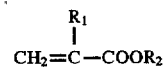 (1)

wherein $R_1$ is a hydrogen atom or methyl group and $R_2$ is a $C_1$ to $C_6$ aliphatic hydrocarbon group, and at least one compound having the general formula (2):

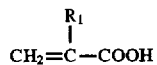 (2)

wherein $R_1$ has the same meaning as in (1), and wherein at least a portion of said carboxyl groups of said copolymer are esterified by addition of a compound having the general formula (3):

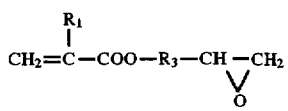 (3)

wherein $R_1$ has the same meaning as in (1) and (2), and $R_3$ is a $C_1$–$C_{12}$ aliphatic or aromatic hydrocarbon group, and wherein said copolymer has a weight average molecular weight of 20,000 to 70,000, a softening point of 30° C. to 130° C., and an acid value of 120 to 150, (b) a sensitizer comprising 2-methyl(4-methylthio) phenyl)-2-morpholino-1-propane as a main component and containing one or more different types of sensitizers, and (c) a diluent having a boiling point of 100° C. or more under atmospheric pressure and containing an unsaturated compound having at least two methacryloyl or acryloyl groups.

12. A photopolymerizable composition useful as a solder mask comprising:

(a) a copolymer possessing carboxyl groups, and which is a reaction product consisting of at least one compound having the formula (1):

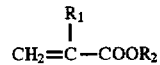 (1)

wherein $R_1$ is a hydrogen atom or methyl group and $R_2$ is a $C_1$ to $C_6$ aliphatic hydrocarbon group, and at least one compound having the general formula (2):

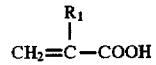 (2)

wherein $R_1$ has the same meaning as in (1), and wherein at least a portion of said carboxyl groups of said copolymer are esterified by addition of a compound having the general formula (3):

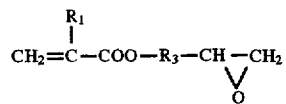 (3)

wherein $R_1$ has the same meaning as in (1) and (2), and $R_3$ is a $C_1$–$C_{12}$ aliphatic or aromatic hydrocarbon group, and wherein said copolymer has a weight average molecular weight of 20,000 to 70,000, a softening point of 30° C. to 130° C., and an acid value of 120 to 150;

(b) a sensitizer comprising 2-methyl(4-methylthio) phenyl)-2-morpholino-1-propane as a main component and containing one or more different types of sensitizers, and (c) a diluent having a boiling point of 100° C. or more under atmospheric pressure and containing an unsaturated compound having at least two methacryloyl or acryloyl groups.

* * * * *

UNITED STATES PATENT AND TRADEMARK OFFICE
CERTIFICATE OF CORRECTION

PATENT NO : 5,723, 261
DATED : March 3, 1998
INVENTOR(S): Yanagawa et al.

It is certified that error appears in the above-identified patent and that said Letters Patent is hereby corrected as shown below:

Column 1, line 21:   change "form" to --from--.

Column 1, line 52:   change "sued" to --used--.

Column 6, line 18:   change "molpho" to --morpho--.

Column 6, line 29:   change "proprane" to --propane-- and "molpholyno" to --morpholino--.

Column 6, line 42:   change "molpholyno" to --morpholino--.

Column 6, line 51:   cahnge "molpholyno" to --morpholino--.

Signed and Sealed this

Fourth Day of May, 1999

Attest:

Q. TODD DICKINSON

Attesting Officer        Acting Commissioner of Patents and Trademarks